(12) United States Patent
Liu

(10) Patent No.: US 10,804,394 B2
(45) Date of Patent: Oct. 13, 2020

(54) FIN STRUCTURES ON A FULLY DEPLETED SEMICONDUCTOR LAYER INCLUDING A CHANNEL REGION

(71) Applicant: Avago Technologies International Sales Pte. Limited., Singapore (SG)

(72) Inventor: Qing Liu, Irvine, CA (US)

(73) Assignee: Avago Technologies International Sales Pte. Limited, Singapore (SG)

( * ) Notice: Subject to any disclaimer, the term of this patent is extended or adjusted under 35 U.S.C. 154(b) by 0 days.

(21) Appl. No.: 16/137,148

(22) Filed: Sep. 20, 2018

(65) Prior Publication Data

US 2020/0098914 A1    Mar. 26, 2020

(51) Int. Cl.
| | |
|---|---|
| *H01L 29/78* | (2006.01) |
| *H01L 27/12* | (2006.01) |
| *H01L 29/06* | (2006.01) |
| *H01L 21/84* | (2006.01) |
| *H01L 29/66* | (2006.01) |

(52) U.S. Cl.
CPC ........ *H01L 29/7838* (2013.01); *H01L 21/845* (2013.01); *H01L 27/1211* (2013.01); *H01L 29/0649* (2013.01); *H01L 29/66795* (2013.01); *H01L 29/785* (2013.01)

(58) Field of Classification Search
CPC ..... H01L 21/823431; H01L 21/823821; H01L 21/845; H01L 27/0886; H01L 27/0924; H01L 27/10826; H01L 27/10879; H01L 27/1211; H01L 29/41791; H01L 29/66795–66818; H01L 29/785–7856; H01L 2029/7857–7858; H01L 2924/13067; H01L 21/76264; H01L 21/76283; H01L 29/7851; H01L 29/7853; H01L 29/7854; H01L 29/7838; H01L 29/0649

See application file for complete search history.

(56) References Cited

U.S. PATENT DOCUMENTS

| | | | |
|---|---|---|---|
| 8,796,759 B2 | 8/2014 | Perng et al. | |
| 9,082,852 B1 | 7/2015 | Liu et al. | |
| 2006/0289948 A1 | 12/2006 | Brown et al. | |
| 2008/0096334 A1* | 4/2008 | Kobayashi | ............ H01L 21/845 438/157 |
| 2013/0062692 A1 | 3/2013 | Chen et al. | |
| 2013/0299922 A1 | 11/2013 | Choi et al. | |
| 2014/0117453 A1 | 5/2014 | Lu | |
| 2014/0220752 A1 | 8/2014 | Park et al. | |
| 2015/0076615 A1* | 3/2015 | Erickson | ........... H01L 29/66803 257/377 |
| 2015/0255457 A1* | 9/2015 | Loubet | ................ H01L 27/0886 257/77 |
| 2016/0300755 A1* | 10/2016 | Gan | ................ H01L 21/823431 |
| 2016/0322259 A1* | 11/2016 | Cheng | ................ H01L 21/3086 |
| 2017/0263647 A1* | 9/2017 | Liu | ..................... H01L 29/7851 |

(Continued)

*Primary Examiner* — Younes Boulghassoul
(74) *Attorney, Agent, or Firm* — Foley & Lardner LLP

(57) ABSTRACT

A transistor includes at least one fin structure (e.g., three fin structures) and a gate. The fin structure is disposed above a semiconductor layer above an insulator layer of a semiconductor on insulator substrate. The gate is disposed over at least three sides of the fin structure and a portion of the semiconductor layer. A channel for the transistor is disposed in fin structure and the portion under the gate.

20 Claims, 4 Drawing Sheets

(56) References Cited

U.S. PATENT DOCUMENTS

2019/0027470 A1\* 1/2019 Han ................ H01L 21/265
2019/0207020 A1\* 7/2019 Lin ................ H01L 29/7789
2019/0267491 A1\* 8/2019 Yeh ................ H01L 29/7851
2019/0296054 A1\* 9/2019 Yoon ................ H01L 29/0847

\* cited by examiner

FIN STRUCTURES ON A FULLY DEPLETED SEMICONDUCTOR LAYER INCLUDING A CHANNEL REGION

TECHNICAL FIELD

This disclosure relates to transistors. This disclosure also relates to structures and fabrication techniques for Fin field effect transistors (FINFETS).

BACKGROUND

Rapid advances in electronics and communication technologies, driven by immense customer demand, have resulted in the widespread adoption of electronic devices of every kind. The transistor is a fundamental circuit component of these devices. Transistors have a wide range of circuit applications, and FINFETS have been used in complementary metal oxide semiconductor (CMOS) processes. Improvements in transistor design improve the implementation and manufacturability of integrated circuits (ICs) used in electronic and communication devices.

BRIEF DESCRIPTION OF THE DRAWING

Various objects, aspects, features, and advantages of the disclosure will become more apparent and better understood by referring to the detailed description taken in conjunction with the accompanying drawings, in which like reference characters identify corresponding elements throughout. In the drawings, like reference numbers generally indicate identical, functionally similar, and/or structurally similar elements.

DETAILED DESCRIPTION

Figure 1:
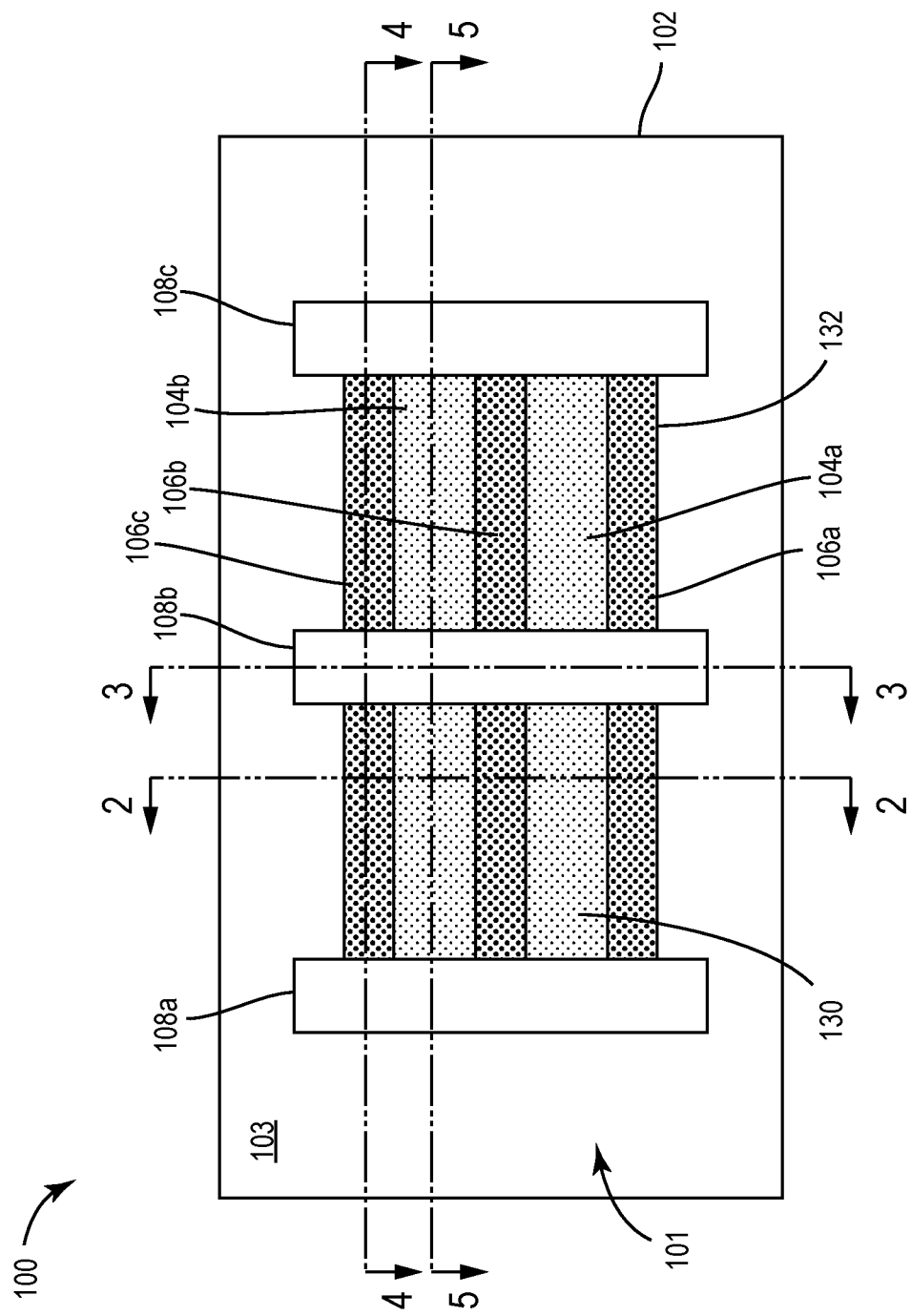
FIG. 1 is a planar top view schematic drawing of a fully depleted (FD) semiconductor-on-insulator (SOI) FINFET structure according to some embodiments.

Before turning to the features, which illustrate the exemplary embodiments in detail, it should be understood that the application is not limited to the details or methodology set forth in the description or illustrated in the figures. It should also be understood that the terminology is for the purpose of description only and should not be regarded as limiting.

Referring generally to the figures, systems and methods of making a transistor structure achieve advantages of FINFET structures and FD SOI structures according to some embodiments. In some embodiments, a FINFET is provided that has a non-quantized width. The non-quantized width extends beyond the width of the fin using an FD layer of an SOI substrate in some embodiments. In some embodiments, a FINFET is provided on an SOI substrate and is fabricated using operations of 28 nm/22 nm and below FINFET and CMOS fabrication processes.

In some embodiments, the effective channel width of the FINFET structure is increased without increasing the fin width and higher drive current is achieved. In some embodiments, a back bias is applied to the FD SOI substrate to control threshold voltages and increase switching speeds. In some embodiments, the back bias is dynamically controlled and provided through a buried oxide (BOX) layer.

In some embodiments, the structure and methods improve effective channel width by more than 10% (e.g., at least 12%) and accordingly improve current capacity by more than 10 percent (e.g., at least 12%). The FINFET structure is manufactured in a FINFET process without additional masks or process steps. In some embodiments, the structure provides a FD SOI FINFET with three fins. In some embodiments, the structure provides a FD SOI FINFET with a single fin, a dual fin, or other numbers of fins.

Some embodiments relate a transistor including at least one fin structure and a gate. The fin structure is disposed above an insulator layer of a semiconductor on insulator substrate. The gate is disposed over at least three sides of the fin structure and a portion of the semiconductor layer. A channel for the transistor is disposed in fin structure and the portion under the gate.

Some embodiments relate to an integrated circuit a first semiconductor fin structure disposed above a fully depleted semiconductor layer, a second semiconductor fin structure disposed above the fully depleted semiconductor layer, and a third semiconductor fin structure disposed above the fully depleted semiconductor layer. The first semiconductor fin structure is disposed in parallel with the second fin structure, and the second semiconductor fin structure is disposed in a parallel with the third semiconductor fin structure. The first semiconductor fin structure is spaced from the second semiconductor fin structure by a first distance, and the second semiconductor fin structure is spaced from the third semiconductor fin structure by a first distance. The integrated circuit also includes a first channel region portion between the first semiconductor fin and the second semiconductor fin structure in the fully depleted semiconductor layer, and a second channel region portion between the third semiconductor fin structure and the second semiconductor fin structure in the fully depleted semiconductor layer. The integrated circuit also includes a gate disposed over at least three sides of the first semiconductor fin structure, the second semiconductor fin structure, and the third semiconductor fin structure. The gate is disposed over the first channel region portion and the second channel region portion.

Some embodiments relate to a method. The method includes providing an isolation region at least partially within a semiconductor-on-insulator substrate. The semiconductor-on-insulator substrate includes a semiconductor layer above a dielectric layer. The method also includes providing a mask above the semiconductor layer, and etching the semiconductor layer using the mask to provide a first fin structure, a second fin structure, and a third fin structure. The semiconductor layer is etched so that a first portion of the semiconductor layer is between the first fin structure and the second fin structure and a second portion of the semiconductor layer is between the third fin structure and the second fin structure. The first portion and the second portion have a smaller thickness than a height of the first fin structure, the second fin structure, and the third fin structure. The method also includes providing a gate over the first fin structure, the second fin structure, and the third fin structure and over the first portion and the second portion.

Figure 2:
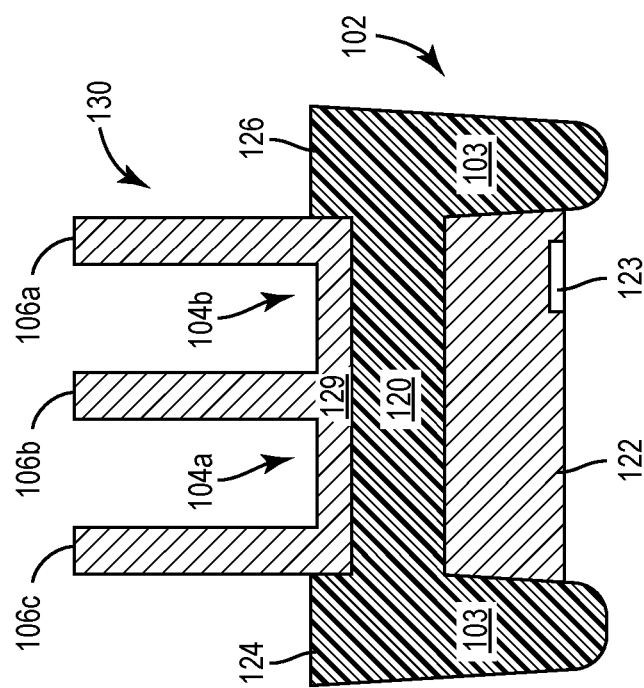
FIG. 2 is cross-sectional view schematic drawing of the FD SOI FINFET structure illustrated in FIG. 1 taken at line 2-2 according to some embodiments.

With reference to FIGS. 1-5, an integrated circuit or semiconductor structure 100 includes at least one transistor 101. The transistor 101 is provided within a perimeter of a trench isolation region 103 providing in a semiconductor-on-insulator substrate 102 (e.g., a fully deplete silicon-on-insulator substrate). The substrate 102 includes at least one fin structure, such as, fin structures 106a, 106b, and 106c disposed above an insulative layer 120 (FIG. 2). In some embodiments, the substrate 102 can be formed using any suitable material, such as silicon, silicon germanium, germanium, etc. The substrate 102 can include other structures (not shown) such as isolation, doped wells that can be formed by implantation and doping techniques. The semiconductor-on-insulator substrate 102 includes a bulk substrate 122 with a back bias terminal 123, the insulative layer 120 (e.g., buried silicon dioxide material), and a semiconductor layer 129. The semiconductor layer 129 is a fully depleted silicon layer which is less than 15 nanometers thick, such as an 8 nm thick layer at a portion 104a between the fin structures 106a and 106b and at a portion 104b between the fin structure 106b and 106c and is less than 115 nm thick at the fin structures 106a-c.

Although three fin structures 106a, 106b, and 106c are shown in FIG. 1-5, the transistor 101 can be fabricated with any number of fin structures 106a, 106b, and 106c (e.g., 1, 3, 4, 5, etc.) depending upon system parameters and design criteria such as current requirements. The three fin structures 106a, 106b, and 106c are fabricated from the material of the semiconductor layer 129. The fin structures 106a-c can be dimensioned according to device parameters. For example, the fin structures have a height of less than 100 nm (e.g. 50 nm), a width of less than 20 nm (e.g., 10 nm), a pitch of less than 60 nm (e.g., a 40 nm) and a spacing between the three fin structures 106a, 106b, and 106c of less than 50 nm (e.g., 20 nm) in some embodiments. Although the fin structures 106a, 106b, and 106c are fabricated from the material of the semiconductor layer 129, the three fin structures 106a, 106b, and 106c are described as being disposed above the semiconductor layer 129 for simplicity of explanation. The length of the fin structures 106a-c can be chosen for device performance and is defined by the trench isolation region 103 in some embodiments. For example, longer gate widths and larger drain/source regions 130 and 132 are achieved with wider fin structures 106a-c and longer fin structures 106a-c in some embodiments. In some embodiments, the fin structures 106a-c are provided above a thin, planar semiconductor layer 129 and are etched from material deposited above the thin, planar semiconductor layer 129.

The transistor 101 includes a gate 108b, a dummy gate 108a, a dummy gate 108c, a drain/source region 130 (FIGS. 2, 4 and 5), a drain/source region 132 (FIGS. 4 and 5), and a channel region 134 (FIG. 3) according to some embodiments. The gate 108b is a polysilicon material disposed above a gate dielectric. The polysilicon material can be replaced with a metal material. The gate dielectric is a high K gate dielectric material or an oxide material in some embodiments.

The position, characteristics, and sizes of the drain/source regions 130 and 132 can vary in some embodiments. The term "drain/source" refers to a source or a drain in some embodiments. The drain/source region 130 and the drain/source region 132 are heavily doped N or P regions formed in an epitaxial process in some embodiments.

Figure 4:
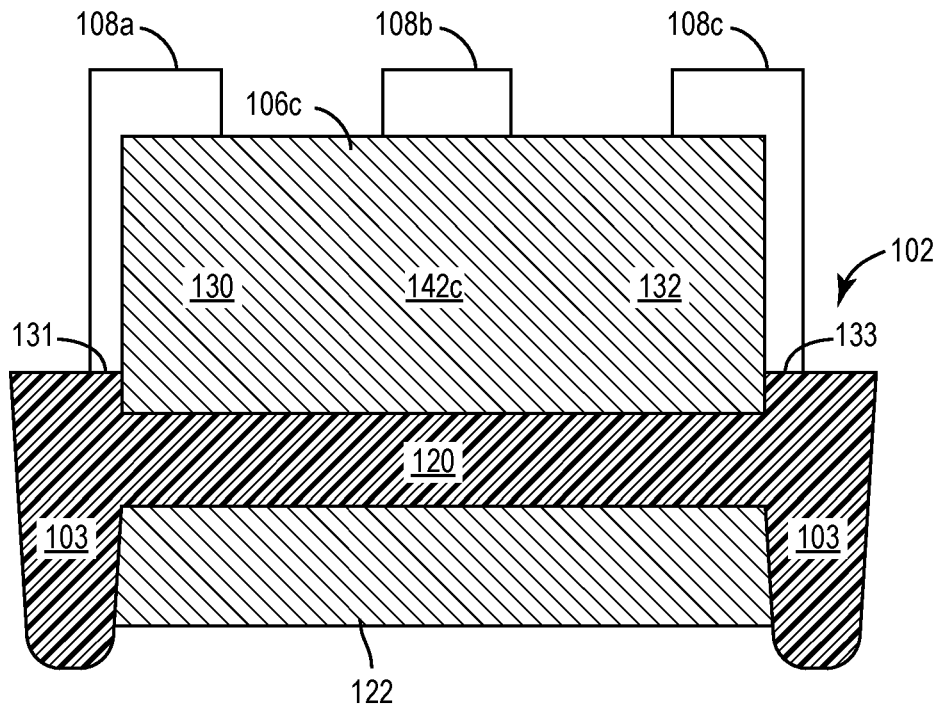
FIG. 4 is cross-sectional view schematic drawing of the FD SOI FINFET structure illustrated in FIG. 1 taken at line 4-4 according to some embodiments.

The drain/source region 130 is bounded by the dummy gate 108a which is partially over a portion 131 of the trench isolation region 103 and the drain/source region 132 is bounded by the dummy gate 108c which is at least partially over a portion 133 of the trench isolation region 103 (FIG. 4). The dummy gates 108a and 108c are a polysilicon material, which can be replaced with a metal material in some embodiments.

Figure 3:
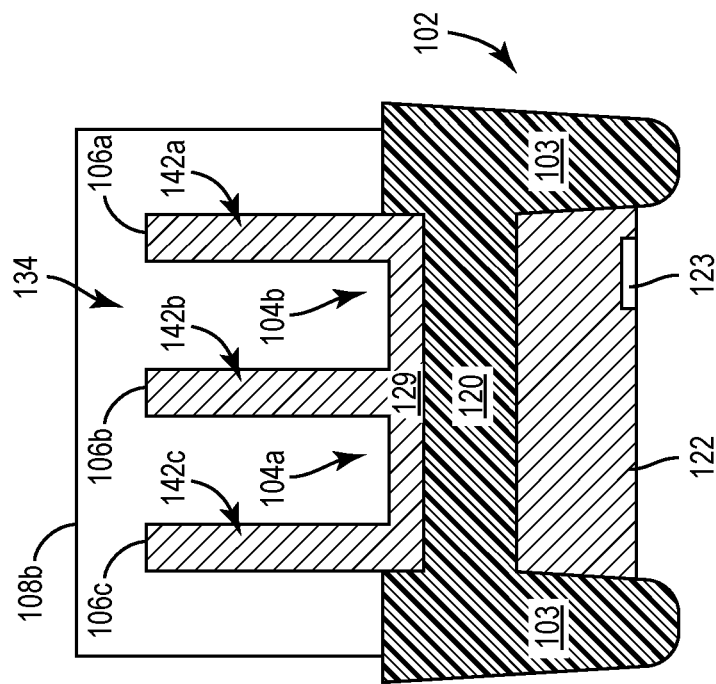
FIG. 3 is cross-sectional view schematic drawing of the FD SOI FINFET structure illustrated in FIG. 1 taken at line 3-3 according to some embodiments.

With reference to FIG. 3, the channel region 134 includes a channel portion 142a of the fin structure 106a, a channel portion 142b of the fin structure 106b, a channel portion 142c of the fin structure 106c, a portion 104a of the semiconductor layer 129 between the fin structure 106a and the fin structure 106b, and a portion 104b of the semiconductor layer 129 between the fin structure 106c and the fin structure 106b. Accordingly, the channel region 134 has a square wave type cross section or repeating trench cross section in some embodiments. The channel region 134 has an effective gate width of the fin height multiplied by two plus the fin width for each fin structure 106a-c, plus the width of portions 104a-b (e.g., gate width equals 370 nm for a fin height of 50 nm, a fin width of 10 nm and a spacing of 20 nm–gate width=(50 nm*2+10 nm)*3+2*20 nm=370 nm). The transistor 10 achieves a 10 percent increase or more in gate width above a three fin structure of similar dimensions without the portions 104a and 104b (e.g. 370 nm/330 nm−1=12 percent increase in channel width) in some embodiments. The increased channel width provides greater current capability (e.g., greater than 10 percent improvement). The channel length of the channel region is dictated by the width of the gate 108b (e.g., from left to right in FIG. 1)

Other fin heights, widths, spacings and pitches can be chosen based upon fabrication limitations, device parameters, and transistor requirements. The transistor requirements include, but are not limited to, a width of the transistor, a depth of the transistor, and a gate length of the transistor according to some embodiments. In some embodiments, only a single fin structure is provided with one portion 104a or 104b. In some embodiments, only a single fin structure is provided with both portions 104a and 104b. In some embodiments, two fin structures are provided with one or both of the portions 104a and 104b. In some embodiments, more than three fin structures are provided with additional intermediate portions similar to the portions 104a and 104b.

The channel region 134 is an undoped fully depleted region underneath the gate 108b in some embodiments. In some embodiments, only the portions 104a and 104b of the channel region 134 are fully depleted regions. In some embodiments, the channel region 134 is partially doped and is a partially depleted region. In some embodiments, only the portions 142a-c are partially doped and are partially depleted regions while the portions 104a and 104b are fully depleted.

Figure 5:
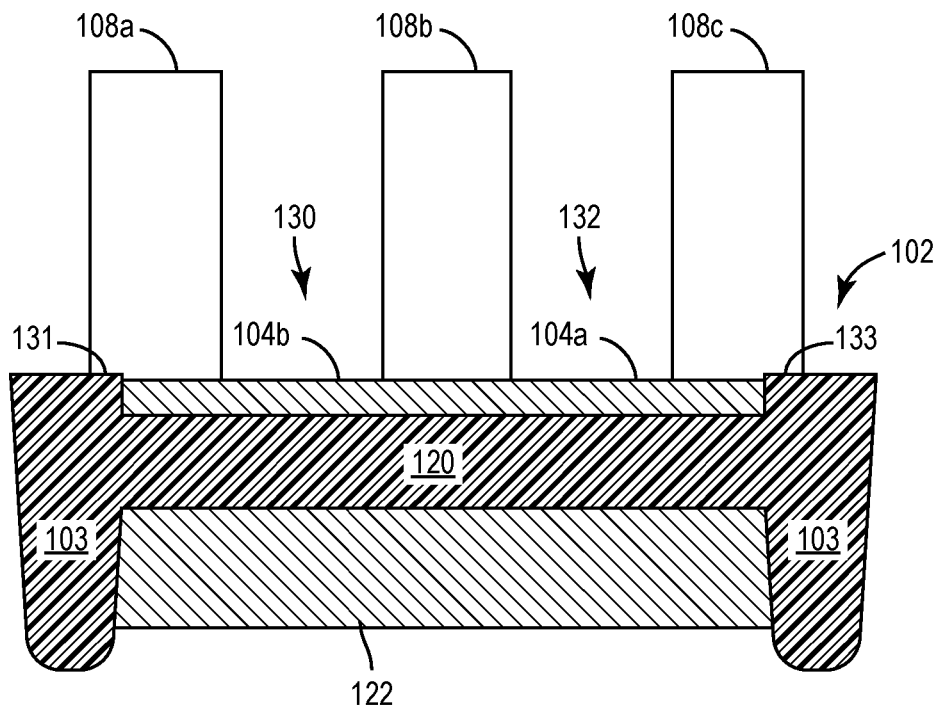
FIG. 5 is cross-sectional view schematic drawing of the FD SOI FINFET structure illustrated in FIG. 1 taken at line 5-5 according to some embodiments.
Figure 6:
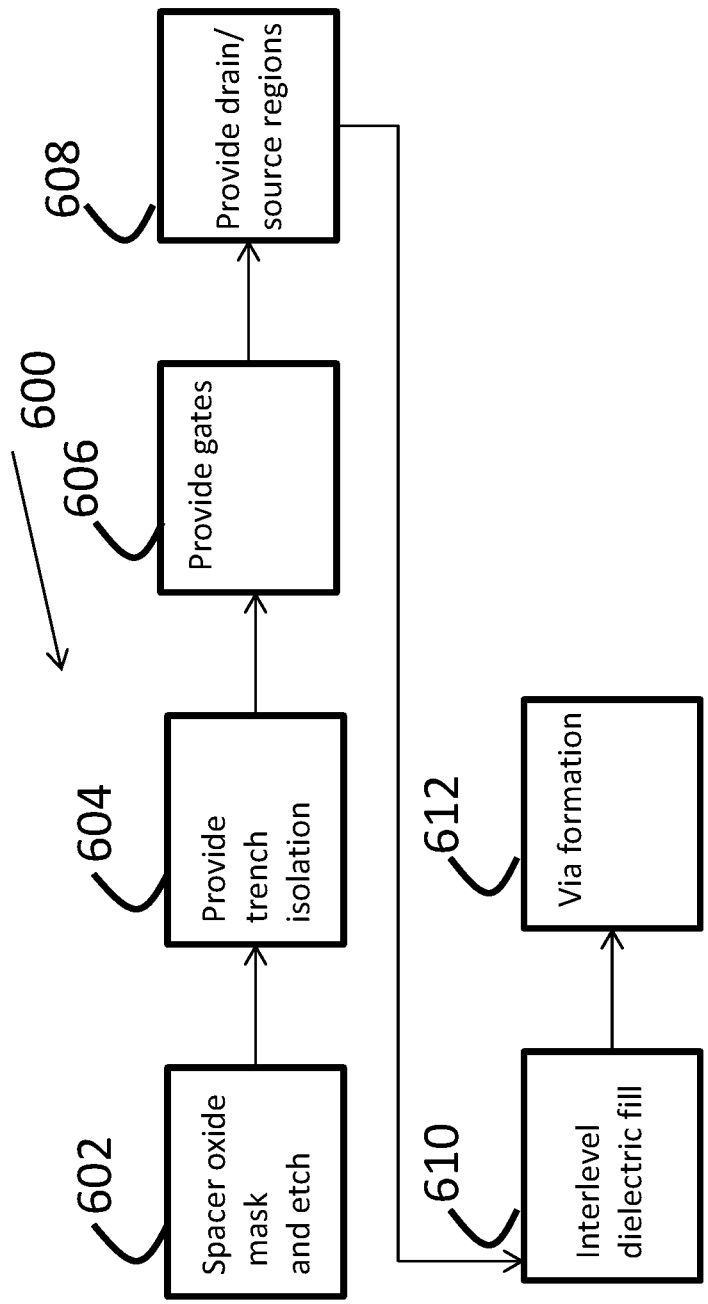
FIG. 6 is a flow diagram showing operations for fabricating the FD SOI FINFET structure illustrated in FIG. 1 according to some embodiments.

An exemplary flow 600 for fabricating the semiconductor structure 100 is described below with reference to FIGS. 1-6 according to some embodiments. With reference to FIG. 6, the semiconductor-on-insulator substrate 102 including the bulk substrate 122, the insulative layer 120, and the semiconductor layer 129 is covered with a hard mask and a mandrel for forming the fin structure 106a-c. The semiconductor layer 129 is 60 nm thick in some embodiments. In an operation 602, the mandrel is subjected to a side wall oxidation process to form an oxide mask corresponding to the width of the fin structures 106a-c. The width of the oxide mask features are approximately 10 nm in some embodiments. Process control is utilized to obtain the eight nm thickness for the portions 104a and 104b.

After the oxide mask is formed, the semiconductor layer 129 is subject to an etching operation (e.g. dry etching) to form the fin structures 106a-c. The oxide mask achieves fin structure widths smaller than conventional lithographic techniques in some embodiments. The semiconductor layer 129 is etched by reactive ion etching (e.g., ME), dry etching or other process selective to the semiconductor layer 129 below the hard mask layer according to some embodiments. After etching, the hard mask layer is removed. In some embodiments, the fin structures 106a-c are formed using a lithographic patterning and etch operation without oxide spacers or an oxide mask.

The semiconductor layer 129 is etched until approximately eight nm of material is left at the portions 104a and 104b. The depth or height of the fin structures 106a-c is controlled by process selection in some embodiments. Although three fin structures 106a, 106b, and 106c are shown, any number of fin structures, or an array of fin structures can be formed in the substrate 102 according to some embodiments.

At an operation 604, the semiconductor layer 129 including the portions 104a and 104b and the fin structures 106a-c is masked and etched to form the trench isolation regions 103. The etching for the trench isolation regions 103 defines the length of the fin structures 106a-c. The trenches are filled with an oxide material in a deposition operation.

At an operation 606, a gate dielectric material and a polysilicon dummy gate material is deposited in a conformal deposition operation. The gate dielectric material and the polysilicon dummy gate material are selectively removed in a lithographic etching process to leave the gate 108b. In some embodiments, the gate dielectric material is removed from the areas above the ends of the fin structures 106a-c. The polysilicon dummy gate material is selectively removed in a lithographic etching process to leave the dummy gates 108a and 108c. A reactive ion etching, (e.g., RIE), dry etching or other process selective to the polysilicon material can be used to form the dummy gates 108a and 108c according to some embodiments. In some embodiments, the same lithographic etching process used to form the gate 108b is used to form the dummy gates 108a and 108c. Polysilicon material and the dummy gates can be replaced with a metal material such as a copper, aluminum or alloys thereof in some embodiments.

At an operation 608, the drain/source regions 130 and 132 (FIG. 4) are formed. The drain/source regions 130 and 132 are formed in an epitaxial process. The drain/source regions 130 and 132 are disposed at opposing ends of the fin structures 106a-c and the portions 104a and 104b (FIGS. 4 and 5). After epitaxy, an annealing operation is performed. The dummy gates 108a and 108c serve as a boundary against overgrowth for the epitaxial operation. The dopants for the drain/source regions 130 and 132 the can be any suitable types dopants, such as positive-type (P-type) or negative-type (N-type) dopants. The drain/source regions 130 and 132 are formed by selective on implantation according to some embodiments.

At an operation 610, an interlevel dielectric is provided. The interlevel dielectric (ILD) is an oxide layer ($SiO_2$) deposited by chemical vapor deposition in some embodiments. In some embodiments, the dummy gates 108a and 108c and the gate 108b can be removed after the ILD deposition and the voids filled with a replacement gate material.

In an operation 612, conductive vias and contacts can be formed for the transistor 101. Metallization layers can also be provided for the integrated circuit or semiconductor structure 100. The flow 600 advantageously does not require extra masks or extra process steps as compared to a conventional FINFET process in some embodiments. The flow 600 achieves both fully depleted and FINFET advantages.

The disclosure is described above with reference to drawings. These drawings illustrate certain details of specific embodiments that implement the systems and methods and programs of the present disclosure. However, describing the disclosure with drawings should not be construed as imposing on the disclosure any limitations that are present in the drawings. No claim element herein is to be construed as a "means plus function" element unless the element is expressly recited using the phrase "means for." Furthermore, no element, component or method step in the present disclosure is intended to be dedicated to the public, regardless of whether the element, component or method step is explicitly recited in the claims.

It should be noted that certain passages of this disclosure can reference terms such as "first" and "second" in connection with power level for purposes of identifying or differentiating one from another or from others. These terms are not intended to relate entities or operations (e.g., a first power level and a second power level) temporally or according to a sequence, although in some cases, these entities can include such a relationship. Nor do these terms limit the number of possible entities or operations.

It should be noted that although the flows provided herein show a specific order of method steps, it is understood that the order of these steps can differ from what is depicted. Also, two or more steps can be performed concurrently or with partial concurrence. Such variation will depend on the software and hardware systems chosen and on designer choice. It is understood that all such variations are within the scope of the disclosure.

While the foregoing written description of the methods and systems enables one of ordinary skill to make and use what is considered presently to be the best mode thereof, those of ordinary skill will understand and appreciate the existence of variations, combinations, and equivalents of the specific embodiment, method, and examples herein. The present methods and systems should therefore not be limited by the above described embodiments, methods, and examples, but by all embodiments and methods within the scope and spirit of the disclosure.

What is claimed is:

1. A transistor comprising:
   at least one fin structure disposed above a portion of a semiconductor layer, the at least one fin structure having a top and a bottom, the bottom being co-planar with a top surface of the semiconductor layer; and
   a gate disposed over at least three sides of the at least one fin structure and the portion of the semiconductor layer, the portion being adjacent the at least one fin structure, wherein a channel for the transistor is disposed in the at least one fin structure and the portion of the semiconductor layer under the gate, wherein the semiconductor layer is a fully depleted silicon layer of a semiconductor-on-insulator substrate.

2. The transistor of claim 1, wherein the gate is continuous from a first fin structure to a second fin structure.

3. The transistor of claim 1, wherein a drain is disposed at a first end of the at least one fin structure and in a first region of the semiconductor layer outside of the portion and a source is disposed at a second end of the at least one fin structure and in a second region of the semiconductor layer outside of the portion.

4. The transistor of claim 1, further comprising two additional fin structures on each side of the at least one fin structure and the portion extends between the additional fin structures.

5. The transistor of claim 1, wherein a height of the at least one fin structure is 50 nanometers or less, and a width of the at least one fin structure is 10 nanometers or less whereby a channel width of the transistor is at least 10 percent greater due to the channel being partially situated in the portion.

6. The transistor of claim 5, wherein a spacing between neighboring fin structures is 20 nanometers or less.

7. The transistor of claim 1, further comprising:
a trench isolation region surrounding the at least one fin structure, wherein the at least one fin structure comprises three fin structures.

8. The transistor of claim 7, wherein an effective channel width for the transistor is at least 10 percent higher than a perimeter around the at least one fin structure.

9. An integrated circuit comprising:
a first semiconductor fin structure disposed above a fully depleted semiconductor layer;
a second semiconductor fin structure disposed above the fully depleted semiconductor layer;
a third semiconductor fin structure disposed above the fully depleted semiconductor layer, wherein the first semiconductor fin structure is disposed in parallel with the second semiconductor fin structure, and the second semiconductor fin structure is disposed in parallel with the third semiconductor fin structure, wherein the first semiconductor fin structure is spaced from the second semiconductor fin structure by a first distance, and the second semiconductor fin structure is spaced from the third semiconductor fin structure by a second distance;
a first channel region portion between the first semiconductor fin structure and the second semiconductor fin structure in the fully depleted semiconductor layer;
a second channel region portion between the third semiconductor fin structure and the second semiconductor fin structure in the fully depleted semiconductor layer; and
a gate disposed over at least three sides of each of the first semiconductor fin structure, the second semiconductor fin structure, and the third semiconductor fin structure, and wherein the gate is disposed over the first channel region portion and the second channel region portion.

10. The integrated circuit of claim 9, wherein the gate is continuous from the first semiconductor fin structure to the third semiconductor fin structure.

11. The integrated circuit of claim 9, wherein the gate comprises a gate dielectric layer and a gate conductor.

12. The integrated circuit of claim 9, further comprising:
a first dummy gate disposed at least partially above a first isolation trench and a first end of the first semiconductor fin structure, the second semiconductor fin structure, and the third semiconductor fin structure.

13. The integrated circuit of claim 12, further comprising:
a second dummy gate disposed at least partially above a second isolation trench and a second end of the first semiconductor fin structure, the second semiconductor fin structure, and the third semiconductor fin structure.

14. The integrated circuit of claim 12, wherein the first dummy gate is disposed over a first portion of the fully depleted semiconductor layer between the first semiconductor fin structure and the second semiconductor fin structure and over a second portion of the fully depleted semiconductor layer between the third semiconductor fin structure and the second semiconductor fin structure, and wherein a second dummy gate is disposed over a third portion of the fully depleted semiconductor layer between the first semiconductor fin structure and the second semiconductor fin structure and over a fourth portion of the fully depleted semiconductor layer between the third semiconductor fin structure and the second semiconductor fin structure.

15. The integrated circuit of claim 9, further comprising:
a back bias terminal configured to set a voltage threshold for a transistor associated with the gate.

16. An integrated circuit comprising:
at least two semiconductor fin structures disposed in parallel on a fully depleted semiconductor layer, the at least two semiconductor fin structures each having a top and a bottom, wherein the bottom of each of the at least two semiconductor fin structures is co-planar with a top surface of the fully depleted semiconductor layer;
a channel region portion between the at least two semiconductor fin structures in the fully depleted semiconductor layer; and
a gate disposed over at least three sides of each of the at least two semiconductor fin structures, wherein the gate is disposed over the channel region portion.

17. The integrated circuit of claim 16, wherein the gate is continuous from a first semiconductor fin structure to a second semiconductor fin structure of the at least two semiconductor fin structures.

18. The integrated circuit of claim 17, further comprising:
a first dummy gate disposed at least partially above a first isolation trench and a first end of the first semiconductor fin structure and the second semiconductor fin structure.

19. The integrated circuit of claim 18, further comprising:
a second dummy gate disposed at least partially above a second isolation trench and a second end of the first semiconductor fin structure and the second semiconductor fin structure.

20. The integrated circuit of claim 16, wherein the gate comprises a gate dielectric layer and a gate conductor.

* * * * *